US005494743A

United States Patent [19]
Woodard et al.

[11] Patent Number: 5,494,743
[45] Date of Patent: Feb. 27, 1996

[54] ANTIREFLECTION COATINGS

[75] Inventors: Floyd E. Woodard, Los Altos; Larry C. Peck, Mountain View, both of Calif.

[73] Assignee: Southwall Technologies Inc., Palo Alto, Calif.

[21] Appl. No.: 932,488

[22] Filed: Aug. 20, 1992

[51] Int. Cl.[6] ........................................ B32B 5/22
[52] U.S. Cl. .................... 428/336; 428/421; 428/463; 428/480; 428/689; 428/697; 428/698; 428/699; 428/701; 428/702; 204/192.14; 204/192.26; 204/192.27; 204/192.28
[58] Field of Search .................... 428/480, 421, 428/463, 323, 329, 333, 336, 688, 689, 697, 698, 699, 701, 702; 204/192.1, 192.14, 192.15, 192.26, 192.28, 192.27

[56] References Cited

U.S. PATENT DOCUMENTS

| | | | |
|---|---|---|---|
| 4,066,814 | 1/1978 | Chiklis | 428/333 |
| 4,252,843 | 2/1981 | Dorer et al. | 427/162 |

OTHER PUBLICATIONS

Rancourt, J. D., *Optical Thin Films User's Handbook* (1987) McMillan Publishing Company, New York, pp. v–x (title page and table of contents).

*Primary Examiner*—Paul J. Thibodeau
*Assistant Examiner*—R. Follett
*Attorney, Agent, or Firm*—Burns, Doane, Swecker & Mathis

[57] ABSTRACT

Carbon-based polymer substrates such as polyesters are antireflected by applying to the substrates one or more discontinuous layers of inorganic metal compounds having an index of refraction greater than that of the substrates.

24 Claims, 9 Drawing Sheets

MAGNICATION= 100,000X

MAGNIFICATION= 100,000X

MAGNIFICATION= 100,000X

MAGNIFICATION= 100,000X

MAGNICATION= 100,000X

ANTIREFLECTION COATINGS

BACKGROUND OF THE INVENTION

1. Field of the Invention

This invention relates to the treatment of organic polymer surfaces with antireflection coatings. More specifically, this invention relates to a composite structure that includes an organic polymer substrate film having on one or both of its surfaces at least one coating which reduces light reflection and increases light transmission. The coatings of this invention are characterized as causing relatively small amounts of coloration and haze.

2. Description of Prior Art

One method for reducing light reflection from a substrate (such as a polymer surface) is to coat the surface with an antireflective layer having a thickness of about a quarter wavelength. The antireflective layer may be a second polymer, or an inorganic material such as a metal fluoride, metal oxide, or metal nitride, where the deposited layer has a refractive index less than that of the substrate. A method for producing such a layer is disclosed in U.S. Pat. No. 4,066,814. If the deposited antireflection layer is in contact with the air, the maximum reduction in reflection is achieved when the reflective index of the deposited antireflective layer equals the square root of the refractive index of the substrate. This approach has two limitations. First; single layer, low refractive index, antireflection coatings have substantial reflected and transmitted coloration. Secondly, the low refractive index inorganic materials typically used in these antireflection coatings, for example magnesium fluoride, silicon dioxide, or cryolite, are often deposited by evaporative techniques, not by dc magnetron sputtering, a popular method for accurately coating polymer substrates.

Antireflection coatings having wider bandwidths (and consequently less coloration) may also be obtained by using multiple deposited layers. As described in *Optical Thin Films User's Handbook* by James D. Rancourt, Macmillan Publishing Company, 1987, two common antireflective coating designs are the quarter-quarter and the quarter-half-quarter stacks. That is to say, the reflective coating is made up of a number of layers having differing refractive index materials, each equal in thickness to one-quarter or one-half of a wavelength sought to be antireflected. The applicability of these designs to dc magnetron-sputtering is restricted due to materials availability and to manufacturing complexity.

Another way to decrease the reflection of a substrate surface is to include a porous coating. As taught in U.S. Pat. No. 4,252,843, porous coatings which result in a graded refractive index are particularly effective antireflection coatings. However, there are very few commercially viable processes for producing such coatings.

SUMMARY OF THE INVENTION

An effective antireflection coating should add minimal color to the residual reflected light and, in the case of transparent or translucent substrate, should add minimal color to transmitted light. The coating should introduce at most, only minimal haze to the substrate and yet be chemically stable and easily manufactured.

We have found that a carbon-based polymer surface may be effectively antireflected by applying to that surface one or more layers of transparent metal oxides or oxynitrides having indices of refraction greater than the index of the carbon-based polymer. These layers range in cumulative total thickness from about 10 nm to about 300 nm. When viewed with a scanning electron microscope, the high index transparent antireflection layer or layers of this invention are seen to be a low packing density discontinuous deposit consisting of numerous aggregates rising from the carbon-based polymer substrate. The shape, size, and height of individual aggregates vary. However, most have a dendritic stalk-like appearance with some stalks being topped with rounded-oolitic structures that look like florets. In some cases the florets have grown to the point that stalks are not evident. The heights of the stalk/floret structures in an optimally tuned antireflection coating are in the above-noted 10 to 300 nm range and more typically vary from 75 to 150 nm. Diameters of the individual stalks/florets range from 5 to about 250 nm and particularly advantageously from 40 to 130 nm. From top down scanning electron microscope (SEM) photos, it is evident that the packing density of the resulting discontinuous coatings is less than 70%, i.e. from about 10% to about 70% of that observed with a fully continuous monolithic coating.

This invention includes a carbon-based polymer surface coated with the discontinuous antireflection layer of one or more high refractive index metal oxides or oxynitrides. This polymer surface may be a sheet of polymer, a body of polymer, or by a coating of polymer on an otherwise nonpolymeric object or surface.

This invention also provides a method for antireflecting a polymer surface by forming a discontinuous dendritic antireflection layer on a polymer surface in which a discontinuous 10 to 300 nm and especially 50 to 200 nm coating of one or more inorganic metal compounds having indices of refraction above that of the polymer and having a packing density less than 0.7 (that is 70%) times that of the equivalent continuous coating. This layer is deposited by reactive sputtering, especially reactive dc magnetron sputtering, onto the polymer surface.

This invention is also a method for antireflecting a substrate surface such as a glass surface in which a layer of transparent carbon-based polymer is deposited or laminated onto the substrate surface with said layer of polymer carrying a 10 to 300 nm thick coating with a packing density of less than 0.7, made up of one or more metal oxides or oxynitrides having indices of refraction above that of the polymer which coating is deposited onto the layer of polymer before or after lamination.

BRIEF DESCRIPTION OF THE DRAWINGS

This invention will be described with reference to the attached drawings. In these drawings.

FIG. 5 is a side view of the coating. FIG. 6 is a top view.

FIG. 7 is a side view of the coating. FIG. 8 is a top view.

DESCRIPTION OF THE PREFERRED EMBODIMENT

Figure 1:
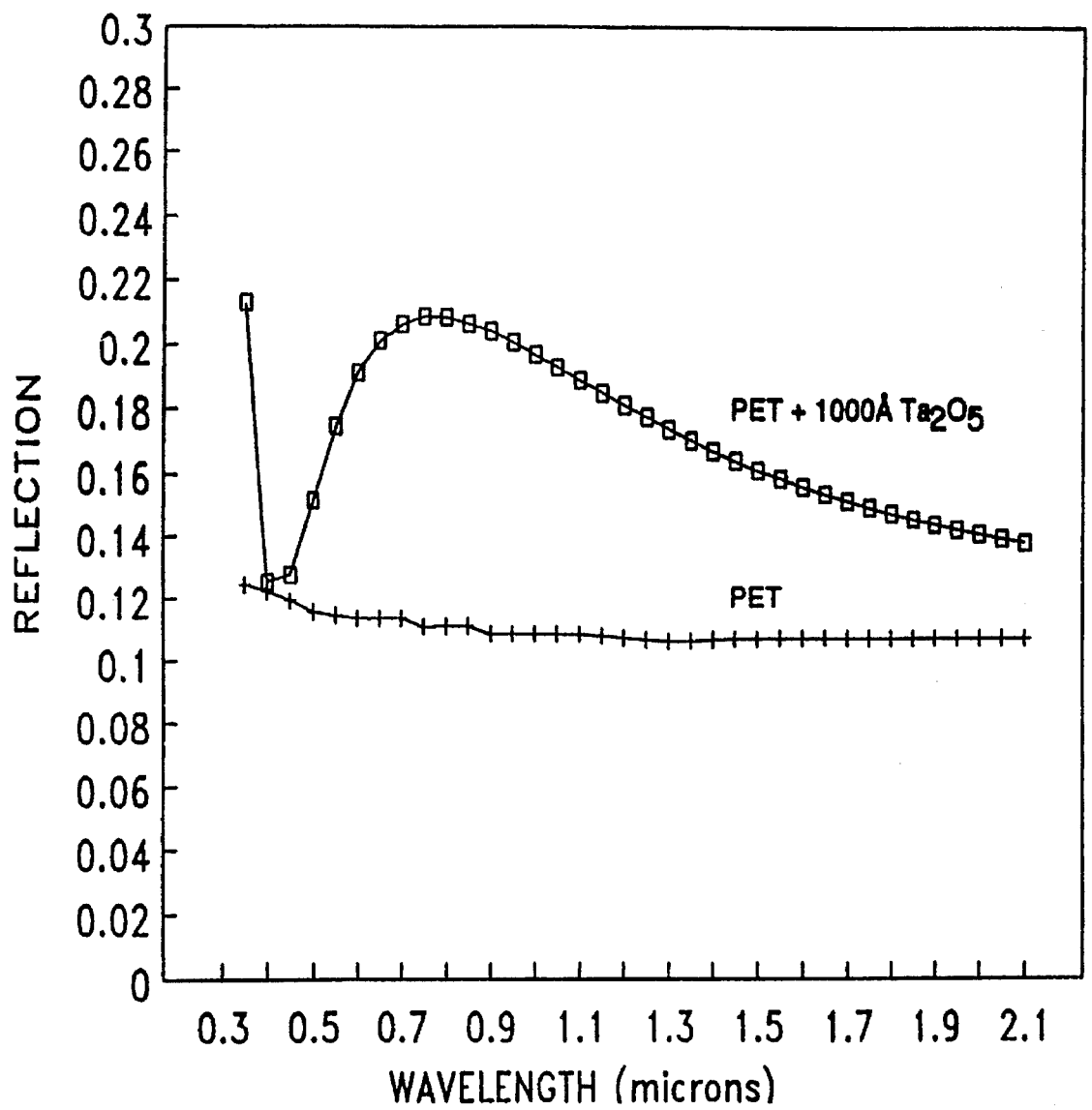
FIG. 1 is a diagram of the reflection increase generally expected when a polymeric substrate is coated with a transparent material having a refractive index greater than the substrate. In particular this figure was obtained from a optical model in which it was assumed that 100 nm of dense sputtered tantalum oxide was deposited onto 0.002 inch thick polyethylene terephthalate. The refractive indices required for the optical model were determined by computer fitting of reflection and transmission spectra (UV, VIS, and NIR) for a PET film and for tantalum oxide sputtered onto a well characterized glass plate. At a wavelength of 550 nm, the values used for tantalum oxide and PET were 2.01 and 1.65, respectively.

As was noted above, this invention is variously a polymer surface which has been coated with antireflective coatings which coatings are one or more inorganic metal compounds having indices of refraction somewhat higher than the index of refraction of the coated polymer. The invention also involves a process for antireflecting polymer surfaces by applying these antireflective metal compound coatings.

Specific embodiments include an antireflective composite having a visible light reflectance below 8% comprising a polyester substrate having an index of refraction of from about 1.4 to 1.7 and a surface having an inherent reflection of about 12%, said surface having adhered thereto a discontinuous 70 to 170 nm thick antireflection layer of oolitic-dendritic aggregates of a transparent inorganic metal compound, said aggregates having a diameter of 5–250 nm and a packing density of 0.2 to 0.7, said layer having an index of refraction of from 1.7 to 2.7, and said transparent inorganic metal compound being selected from the group consisting of oxides and nitrides of tantalum, titanium, niobium, hafnium, tungsten and zirconium.

An antireflective composite comprising a solid organic polymer substrate having adhered thereto a discontinuous 10–300 nm thick antireflection material, said material having a first layer of oolitic-dendritic aggregates of a first transparent inorganic metal oxide or oxynitride, said aggregates having a diameter of 5–250 nm and a second layer of oolitic-dendritic aggregates of a second transparent inorganic metal oxide or oxynitride, said aggregates having a diameter of 5–250 nm and being adhered to and built upon the first layer and wherein each of the first and second layers has an index of refraction which is greater than the index of refraction of the polymer substrate and wherein the antireflection material as a whole has a packing density of 0.1 to 0.7.

An antireflective composite having a visible light reflectance below 8% comprising a polyester substrate having an index of refraction of from about 1.4 to 1.7 and having an inherent reflectance of about 12% and having adhered thereto a first layer of a 25 to 100 nm thick, discontinuous antireflection material, said first layer having oolitic-dendritic aggregates of a first transparent inorganic metal compound selected from the group consisting of oxides and oxynitrides of tantalum, titanium, niobium, hafnium, tungsten and zirconium, said aggregates having a diameter of 5–250 nm and a second layer of oolitic-dendritic aggregates of a second transparent inorganic metal compound selected from the group consisting of oxides and oxynitrides of zinc, tin and indium, said aggregates having a diameter of 5–250 nm and being adhered to and built upon the first layer and wherein each of the first and second layers has an index of refraction of 1.7 to 2.7 and the antireflection material as a whole has a packing density of 0.2 to 0.7.

A process for imparting antireflection properties to a composite material comprising sputter-depositing upon a solid organic polymer substrate a 10–300 nm thick discontinuous antireflection layer of oolitic-dendritic aggregates of a transparent inorganic metal oxide or oxynitride, said aggregates having a diameter of 5–250 nm and a packing density of 0.1 to 0.7, said antireflection layer having an index of refraction greater than the index of refraction of the substrate.

A process for imparting antireflection properties to a composite material comprising sputter-depositing upon a solid organic polymer substrate a 10–300 nm thick discontinuous antireflection material said material having a first layer of oolitic-dendritic aggregates of a first transparent inorganic metal oxide or oxynitride, said aggregates having a diameter of 5–250 nm and a second layer of oolitic-dendritic aggregates of a second transparent inorganic metal oxide or oxynitride, said aggregates having a diameter of 5–250 nm and being adhered to and built upon the first layer and wherein each of the first and second layers have an index of refraction which is greater than the index of refraction of the polymer substrate and the antireflection material as a whole has a packing density of 0.1 to 0.7.

The Polymers which are Antireflected

The polymers which benefit from the antireflection coating and process of this invention are carbon-based materials. They include classic organic polymers such as polyesters and polycarbonates and fluorocarbon and fluorohydrocarbon materials as well. These materials have indices of refraction of from about 1.2 to about 1.7 and especially about 1.4 to about 1.7. Representative organic polymers include polyesters such as poly(ethyleneterephthalate) ("PET"), polycarbonates, polyacrylates and methacrylates such as poly(methylmethacrylate) ("PMMA"), poly(methacrylate), poly(ethylacrylate) and copolymers such as poly(methylmethacrylate-co-ethylacrylate). Fluorocarbon polymers such as teflon can be used as well. Other polymers which have indices of refraction below that of the antireflection coatings may be used, if desired.

Although not a limitation to the application of this invention, clear, transparent, and colorless plastic materials (i.e., plastic sheets, films, or bodies having integrated transmissions over the visual wavelengths of at least about 75%, i.e., from about 70% to about 90% without marked absorption or reflection peaks in this range) yield particularly attractive final products. The materials commonly have from 5 to about 20% reflection over the visual wavelengths, for example PET reflects 10–15% of the visible light.

The polymer substrates themselves are commercially available or can be prepared by various art-known processes.

These polymers may be presented in any form which yields a surface in need of antireflection. Such surfaces can be provided by solid bodies, by films, or by coatings applied or laminated onto nonpolymeric surfaces such as glass.

The Antireflection Coatings

The antireflection coatings are made up of one or more metal oxides or oxynitrides all having a bulk refractive index above that of the polymer. The refractive index of the inorganic material thus ranges from about 1.4 or 1.7 on the low end, to up to about 2.7. In order to minimize distortion and the like, the inorganic metal compound coatings are preferably essentially colorless. An "essentially colorless" coating has an integrated absorption of less than 25% (i.e., 0 to 25%) without significant absorption peaks over the visible wavelengths (400–700 nm).

Oxides and oxynitrides of one or more of a group of metals referred to herein as "primary" metals, i.e., tantalum (Ta), niobium (Nb), titanium (Ti), hafnium (Hf), tungsten (W) and zirconium (Zr) offer especially effective antireflection characteristics. An oxynitride is a metal compound formed with a mixture of oxygen and nitrogen such that at least about 50% of mixture is oxygen. Minor amounts of other materials may be present, if desired. Primary metal compounds include oxides $Ta_2O_5$, $Nb_2O_5$, $TiO_2$, $HfO_2$, $WO_3$ and $ZrO_2$; and mixtures of these oxides with the nitrides $Ta_3N_5$, $Nb_3N_5$, $Ti_3N_4$, $Hf_3N_4$, $WN_2$ and $Zr_3N_4$. These are empirical formulas, the actual materials may be somewhat less fully oxidized or nitrided, say to 0.9 times empirical.

In another preferred configuration, up to about 80% of the primary metal oxides and oxynitrides may be replaced by oxides or oxynitrides of one or more of three metals referred to as the "secondary" metals, i.e. indium (In), tin (Sn) and zinc (Zn), e.g., oxides $In_2O_3$, $SnO_2$ and $ZnO_2$; and mixtures of these oxides with the nitrides $InN$, $Sn_3N_4$, and $Zn_3N_4$. When a layer of one or more of these secondary metal compounds is deposited onto a layer of primary metal compound, excellent results are achieved in terms of transparency, colorlessness, and antireflectivity.

While in theory the primary and secondary metal compounds might be laid down together it is preferred to lay down the primary metal first and then over-coat it with the secondary metal compound. Although not understood with certainty, it appears that the primary metal oxides or oxynitrides may be best applied first so as to establish the dendritic, discontinuous coating structure characteristics of this invention and then overcoated with the secondary metal oxide or oxynitride.

Figure 9:
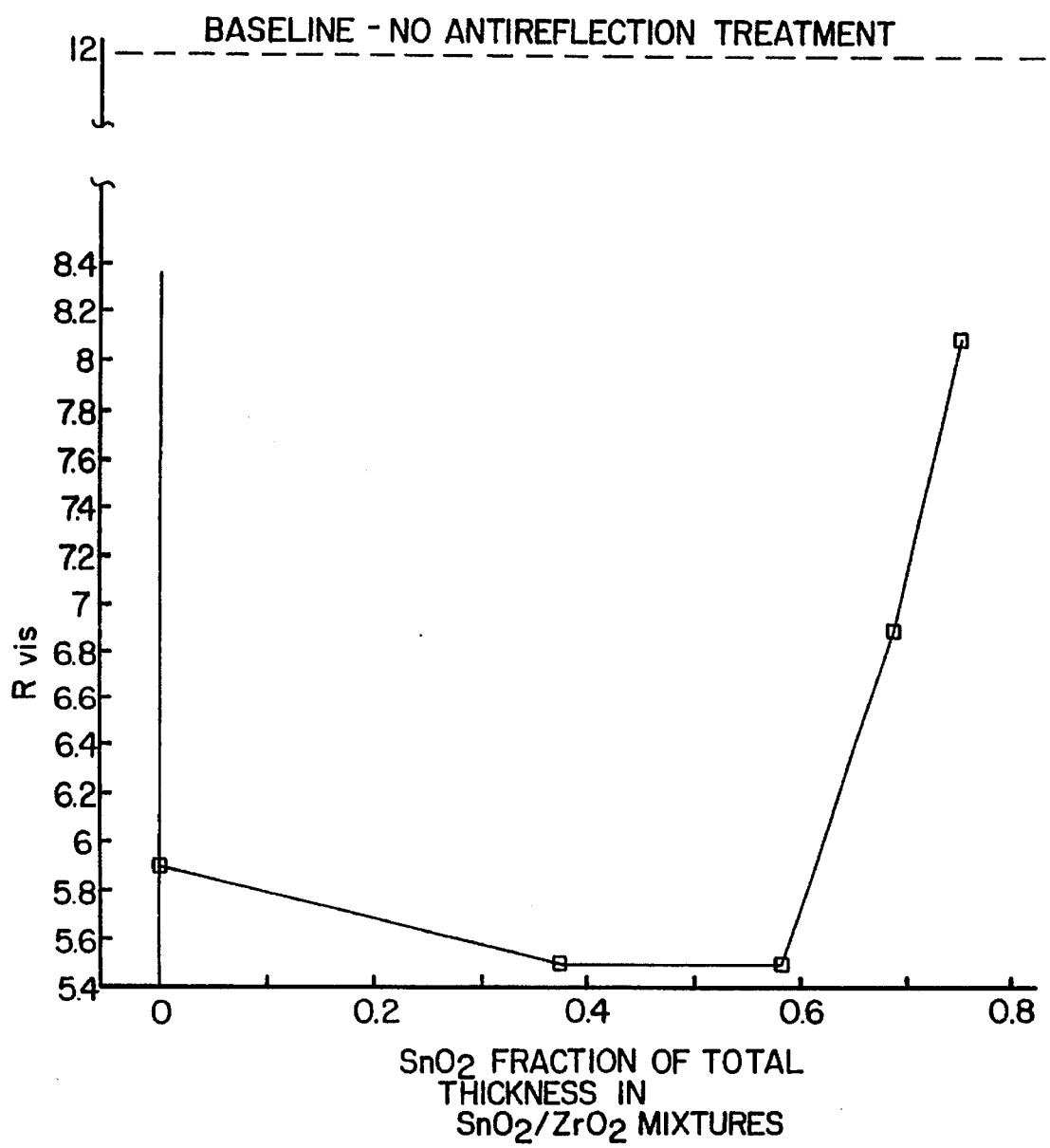
FIG. 9 is a diagram of the level of reflection achieved when varying proportions of a primary metal compound ($ZrO_2$) is replaced with a secondary metal compound ($SnO_2$) in the antireflection layer of this invention.

As shown in FIG. 9 the addition of some amounts of secondary metal compounds actually improves the antireflective properties of the coating. In FIG. 9 a sample of PET is overcoated with the primary metal oxide ($ZrO_2$ and other samples are produced with a layer $ZrO_2$ overcoated with $SnO_2$. The overall thickness is constant and the integrated reflectance drops from 12% (no coating) to 6% (with a pure $ZrO_2$ coating) to 5.5% (with a $ZrO_2/SnO_2$ at coating of 0.4:0.6 to 0.6:0.4 fractions) before then increasing at high fractions of secondary metal compound.

In addition to performance advantages, the use of secondary metal compounds offers manufacturing advantages when using reactive sputter-depositing as the manufacturing method since the secondary metals sputter (in compound form) much more rapidly than do the primary metals.

The thickness of the metal compound layer(s) is tailored. Thickness control is done not only for cost and efficiency reasons but also to optimize the antireflection layer to minimize color distortion both in the transmitted light and in the residual reflected light. With some coatings, a yellow cast may be observed. This yellow cast can be minimized by controlling the coating thickness. Typical coating thicknesses range from 10 to 300 nm and preferably 50 to 200 nm. Especially preferred thicknesses are 70 to 170 nm. Adjusting the thickness within these ranges can tune the reflection spectral minimum to below 700 nm, preferably to less than about 550 nm.

When a secondary metal compound is present such as as a multiple layer coating (primary metal compound layer under secondary metal compound layer), the total thickness is typically within the above limits. As noted previously the relative proportions of primary and secondary metal compounds in the antireflection coating can range from 100% primary to about 20% primary-80% secondary. If one is going to go to the complexity of adding a secondary metal compound it is generally preferred to add more than an insignificant proportion. Thus, the preferred proportion of primary and secondary metal compounds range from about 75% primary-25% secondary to about 25% primary-75% secondary. Integrating these proportions with the overall antireflection layer thicknesses shows that the primary metal compound layer(s) can range from say 5 nm to 300 nm, with the remainder to the total, i.e., 5 to 240 nm being the secondary metal layer(s). Preferred layer thicknesses for the two-layer structures are 25 to 100 nm of primary metal compound and 25 to 100 nm of secondary metal compound with an overall thickness of 50 to 200 nm. Particularly preferred structures have from 35 to 85 nm of primary metal compound and 35 to 85 nm, of secondary metal compound with an overall thickness of 70 to 170 nm.

As will be discussed below and shown in the scanning electron photomicrographs presented in FIGS. 5 and 6, and FIGS. 7 and 8, the antireflection coatings are discontinuous, appearing to be dendritic (i.e. fingerlike) or oolitic (i.e., globularly particulate). All these thicknesses, then, are defined to be the distance from the bottom of the layer to the estimated median of the tops of the dendrites or oolites.

Figure 2:
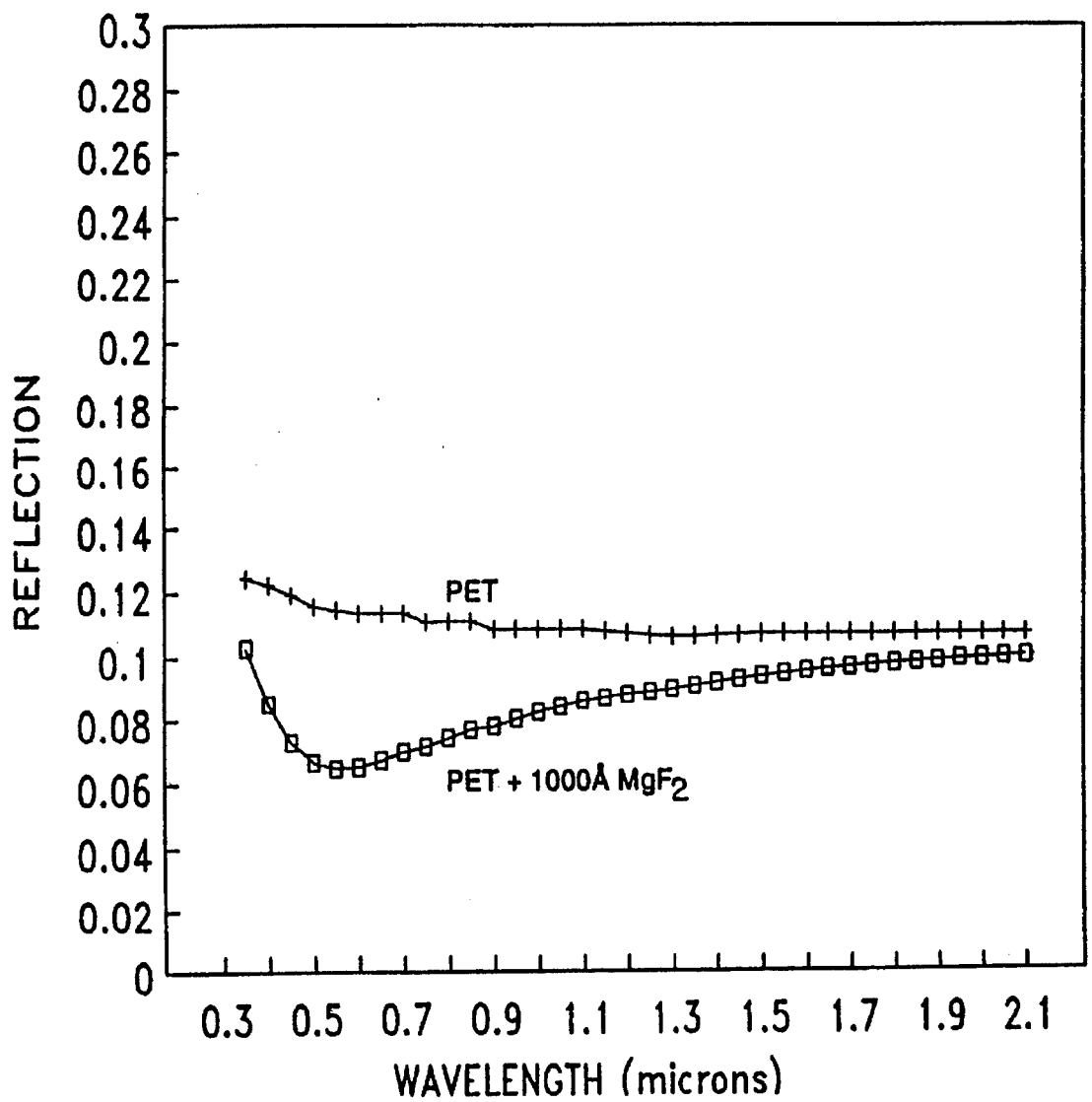
FIG. 2 is a diagram of the reflection decrease expected when a substrate is coated with a transparent material having a refractive index lower than the substrate. This computer simulated spectra was obtained as described for FIG. 1 except the deposited coating was assumed to be similar to magnesium fluoride. The real part of the refractive index was assumed to equal 1.38 with no wavelength dispersion and no absorption.

FIG. 1 shows a generalized diagram of the reflectance spectra expected, based on computer modelling, from a plastic (PET) substrate coated with a transparent material having a refractive index greater than the substrate. In contrast, FIG. 2 shows the spectra expected based on computer modelling from a substrate coated with a material having a refractive index less than the substrate.

Figure 3:
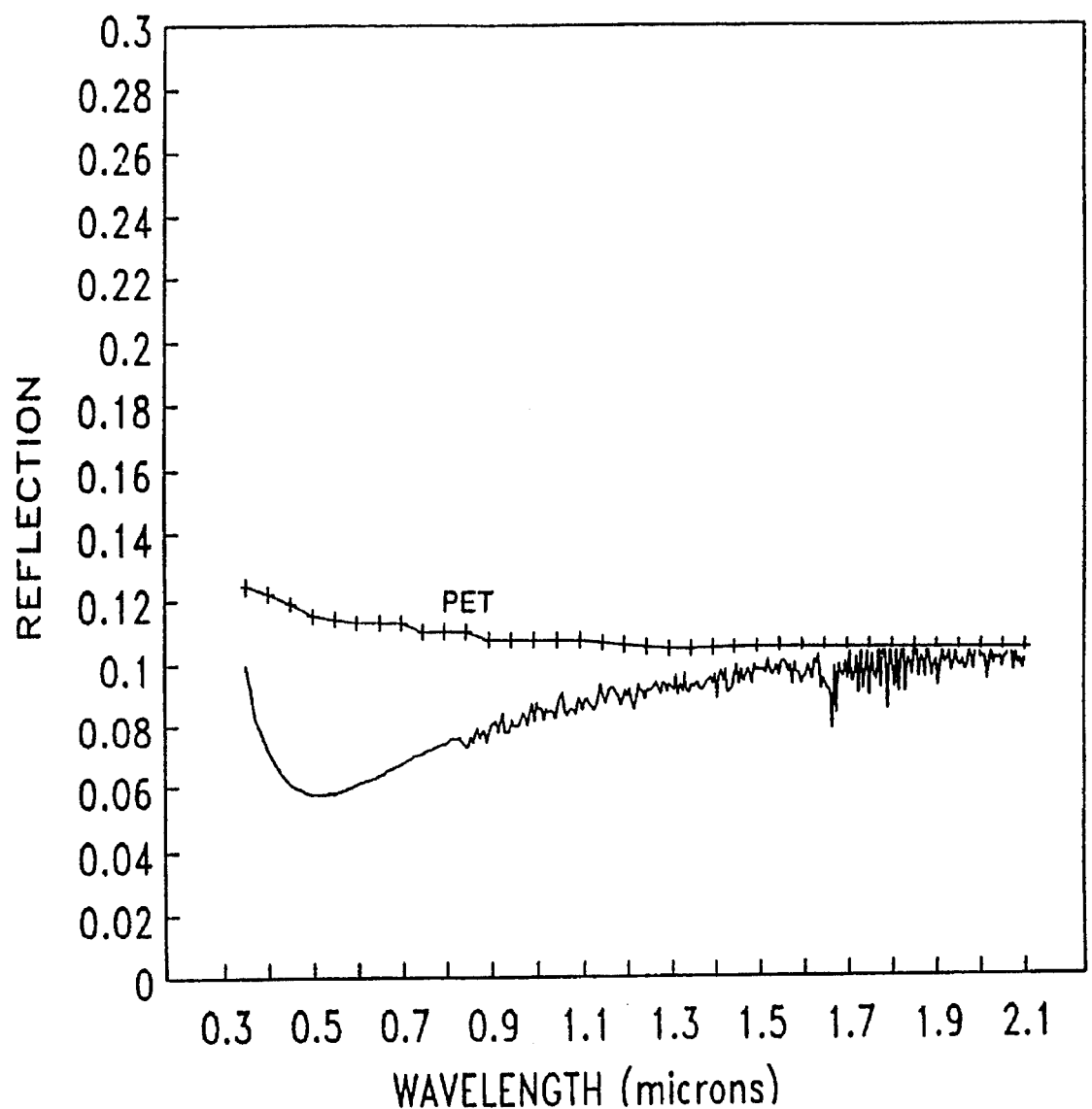
FIG. 3 is the reflection spectra for tantalum oxide sputter-coated onto 0.002 inch thick PET (ICI 393) in accordance with the present invention. The physical thickness for the tantalum oxide coating was about 100 nm.

These two figures show the properties expected when continuous layers of overcoating are applied. In the case of FIG. 1, (coating having a greater index of refraction) the reflectance goes up from 12% (more or less) to as much as 20–21%. When a lower index coating material is used, as in FIG. 2, the reflectance is predicted to drop from 12% to 6% at some wavelengths. FIG. 3 shows the unexpected result which is actually achieved with the coatings of this invention which are discontinuous but based on higher index metal compounds.

Comparing the diagrams of FIGS. 1 and 3 reveals a significant difference between what is expected when a high index transparent material is deposited on a transparent substrate and what is actually observed when the present high index transparent materials (i.e. the oxides of the primary metals) are sputter-deposited onto polymeric substrates in discontinuous low packing density forms. As described in Chapter 4 of the reference text, "*Optical Thin*

*Films Users Handbook*, James D Rancourt, Macmillan Publishing Company, NY, 1987, the conventional coating of FIG. 1 increases the reflection of the substrate above the value observed without the coating, at all wavelengths except those equal to integer multiples of $\lambda/2$, where $\lambda$ refers to the optical thickness of the coating. At wavelengths equal to integer multiples of $\lambda/2$, the reflection of the coated substrate is equal to that of the uncoated substrate, while the reflection of the coated substrate is at a maximum at wavelengths equal to odd integer multiples of $\lambda/4$.

On the other hand, as described in the above mentioned reference and as depicted in FIG. 2, when a transparent material with an index lower than that of the substrate is deposited, reflection minima occur at wavelength which are odd integer multiples of $\lambda/4$.

Contrary to the characteristic performance predicted above for high index materials the high index coatings of the present invention reduce the reflection of the polymeric substrate rather than increase it, as shown in FIG. 3. In fact, as evident from a comparison of FIGS. 2 and 3, the high index materials of the present invention give reflection spectra more typical of low index materials. It should be noted that when these high refractive index materials were coated directly on glass, antireflection was not observed, rather the reflection was increased as was expected. (This is demonstrated herein in Example II.)

In the spectral region of visible light, primary metal compounds (e.g. oxides) exhibit refractive indices of from about 1.8 to about 2.7, secondary metal compounds (e.g. oxides) have refractive indices of 1.8 to 2.2. The carbon-based polymeric substrates have refractive indices of 1.4 to 1.7. It is generally preferred that antireflection coatings for use in the visible region have reflectivity or transmissivity spectra which are as flat as possible between 400 nm and 700 nm. Flat spectra are preferred because they indicate minimal coloration. Coloration can arise from several factors including:

(a) inherent absorption in the coating material or the substrate, (b) wavelength dependent optical interference effects resulting in complementary transmitted and reflected colors, (c) wavelength dependent light scattering (generally shorter wavelength light is scattered most, often resulting in yellow transmitted color).

Methods of Preparation

The antireflection coatings are prepared using sputtering. The primary metal compound layer is laid down on the substrate either alone or before the secondary metal compound is deposited. This might be done by laying the primary metal down from a metal cathode with a magnetron sputterer and an inert sputtering gas such as argon and then converting the laid down metal to the desired compound by reaction with oxygen or a mixture of oxygen and nitrogen with optional hydrogen addition. More commonly, however, the primary metal compound is laid down by direct reactive sputtering in which the sputtering cathode is the primary metal and it is sputtered using reactive gas (oxygen, nitrogen, and hydrogen) and optionally an inert sputtering gas such as argon to give the desired layer of compound. We have had best results with titanium when inert sputtering gas is not added as this tends to minimize unwanted arcing. With other metals the addition of inert sputtering gas gives good results.

Thereafter, and optionally, the secondary metal compound is also deposited, typically by reactive sputtering, again with a suitable gas mixture.

The thickness of the various layers is controlled by varying the voltage and current fed to the electrode targets, the gas flow rates and, in the case of continuous systems where the polymer substrate and sputtering target move relative to one another, the speed at which the substrate is moved past the target.

If desired, the laydown of the primary metal compound layer can be preceded by a mild preglow treatment to improve adhesion.

Figure 4:
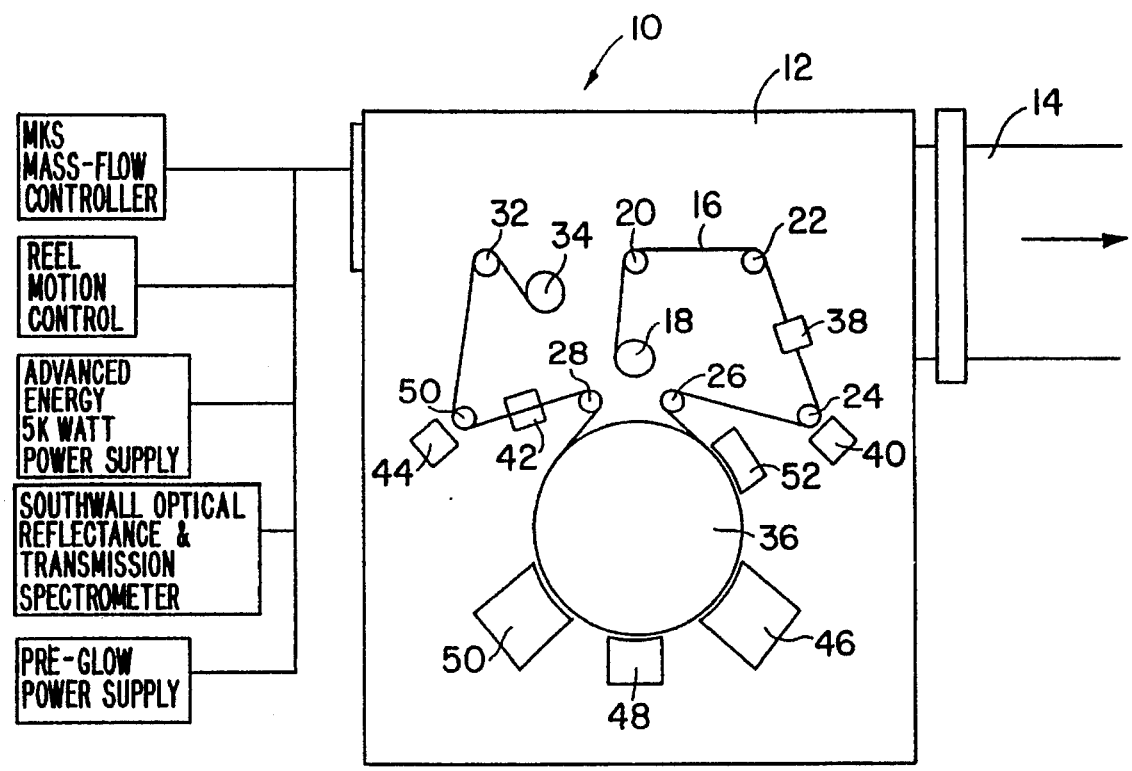
FIG. 4 is a schematic diagram for a magnetron sputtering unit useful for forming the antireflection layers of the invention.
Figure 5:
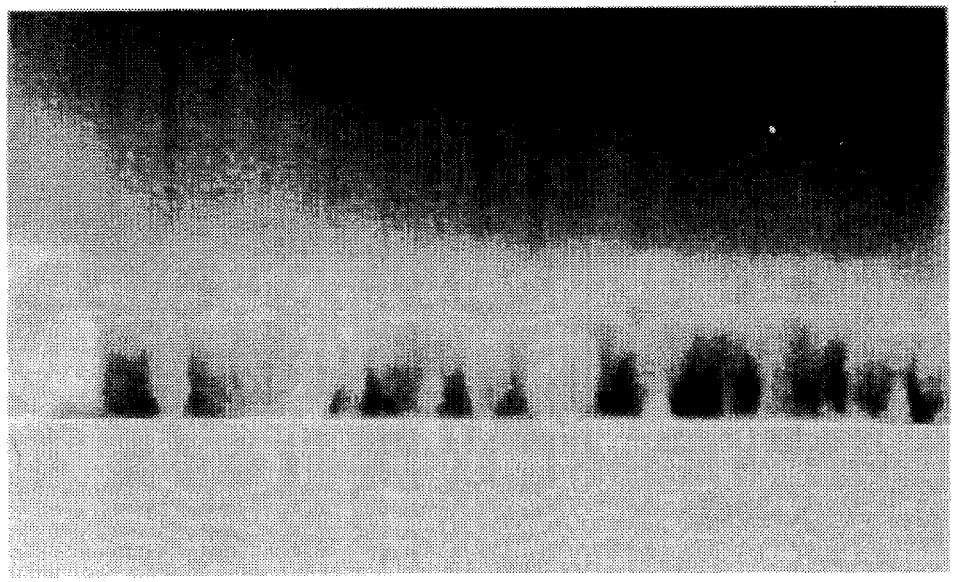
FIGS. 5 and 6 show two scanning electron micrographs taken of a PET substrate coated with titanium oxide in accordance with the present invention.
Figure 6:
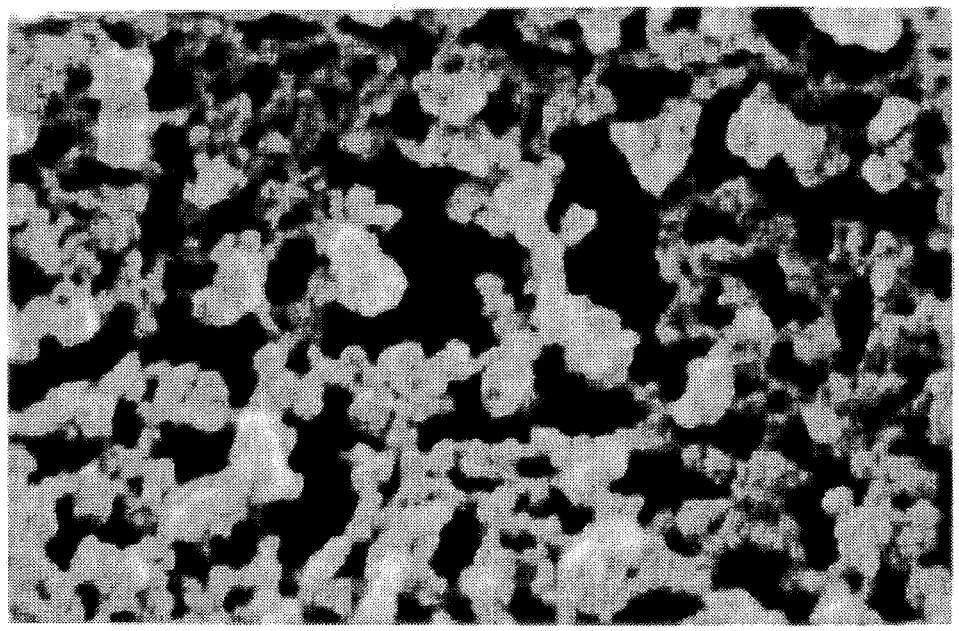

A sputter-deposit apparatus suitable for laying down these various antireflection layers is shown in FIG. 4. Sputter-depositing is a commercial process for depositing inorganic materials, metals, oxynitrides, oxides, and the like on surfaces. Representative descriptions of sputter-depositing processes and equipment may be found in U.S. Pat. Nos. 4,204,942 and 4,948,087, which are incorporated by reference.

In sputtering, a voltage is applied to a metal or metal compound sputtering cathode in the presence of a reactive or nonreactive gas to create a plasma. The action of the sputtering gas plasma on the cathode causes atoms of the cathode (target) to be dislodged and to travel and to deposit upon a substrate positioned adjacent to the sputtering source.

Typically the sputtering gas is a noble gas such as krypton or argon or the like. Argon is the most common sputtering gas because of its attractive cost. It is also known in the art to employ from about 1% to about 90% (or even 100% in the case of a titanium target) of one or more reactive gases as components of a sputtering gas mixture.

When a reactive gas is present, it causes a metal to be deposited as an oxide (when an oxygen source is present), an oxynitride (when an oxygen and nitrogen source is present) and the like. This reactive sputtering process is well known and used commercially.

As applied to the present invention, the reflective metal may be deposited using a sputtering gas which includes oxygen or oxygen and nitrogen to provide an oxide or oxynitride. The primary metal layer is deposited using a cathode of zirconium, tantalum, niobium, titanium, or the like and a sputtering gas including oxygen, and optionally nitrogen and/or hydrogen to give the desired oxide, or oxynitride.

FIG. 4 shows a continuous web coating sputtering machine. The web coating system is shown as System 10 in FIG. 4. System 10 includes vacuum chamber 12 which is evacuated via line 14. Contained within chamber 12 is a drive mechanism for moving a sheet of flexible carbon-based polymer substrate 16 past a series of magnetron sputtering stations 50, 48, and 46. The drive mechanism includes feed roll 18, idlers 20, 22, 24, 26, 28, 30 and 32 and take-up roll 34.

The film passes around chilled idler drum 36 as well. The film passes a pair of monitors for determining its transmittance, 38, and reflectance, 40, before coating and a similar pair of monitors 42 and 44 after coating. This coater is configured to simultaneously sputter coat up to three layers on the web using three separate DC magnetron cathodes 46, 48 and 50. Typically, cathode 46 is used to lay down the primary metal compound layer, after as a nitride, oxynitride, or oxide. Cathode 48 can be used to lay down the secondary metal compound layer. Also located in the system is a pre-glow station 52 for optional ionized gas cleaning or surface modifying of the substrate before coating. Each of these four stations is isolated from each other in space as a mini-chamber (See U.S. Pat. No. 4,298,444); thereby producing a local environment for the containment of the various plasma gasses. This allows separate processes to be carried out simultaneously at each station with variations in atmosphere from station to station but without cross-contamination among the four sources.

The control and monitoring of the sputtering system are normally accomplished using equipment and sensors which are standard in this coating machine. These are shown in FIG. 1 and include: 1) mass flow controllers (MKS) for regulation of gas flow into the cathode mini-chambers; 2) 5–10 kilowatt DC power supplies (Advanced Energy) for all three sputtering cathodes; 3) an optical monitoring system (Hexatron/Southwall Technologies) which measures both reflectance and transmission of the film over the spectral region from 400 to 2000 nm; and 4) a film motion control system (Drivex) which regulates the tension, speed, and distance of the film as it moves through the system.

Use of the Coated Materials

The coated plastic materials of this invention find use in many applications. One application of special interest is as internal plastic surfaces of multipane window glazing units. These plastic surfaces can be present as plastic films or as plastic coatings on glass surfaces. Multipane window constructions containing plastic film or internal glass surfaces are known in the art as shown in U.S. Pat. Nos. 3,935,351; 4,335,166; 4,853,264; and the like.

Figure 7:
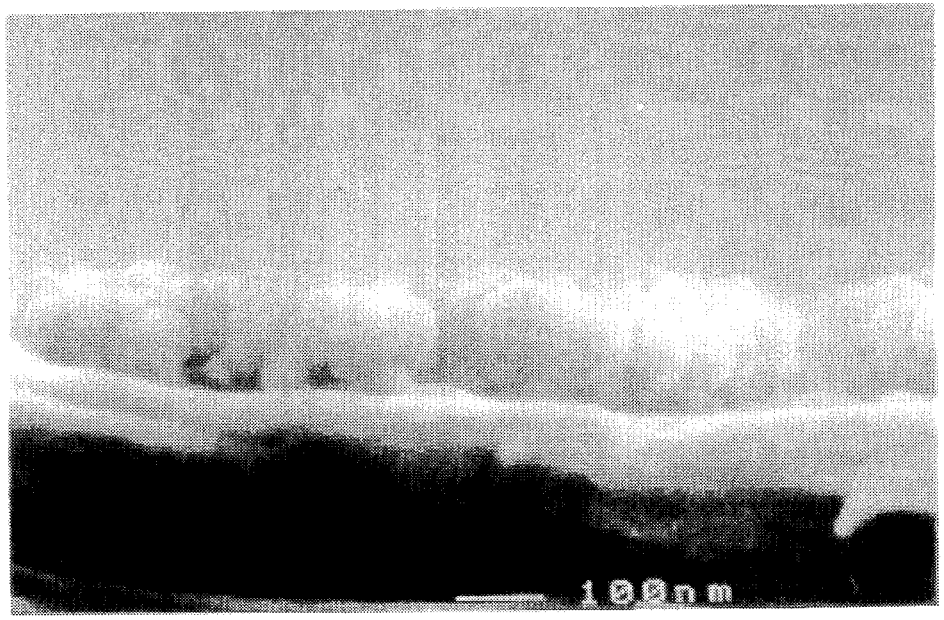
FIGS. 7 and 8 show two scanning electron micrographs taken of a PET substrate coated with a layer of titanium oxide followed by indium oxide in accordance with the present invention.
Figure 8:
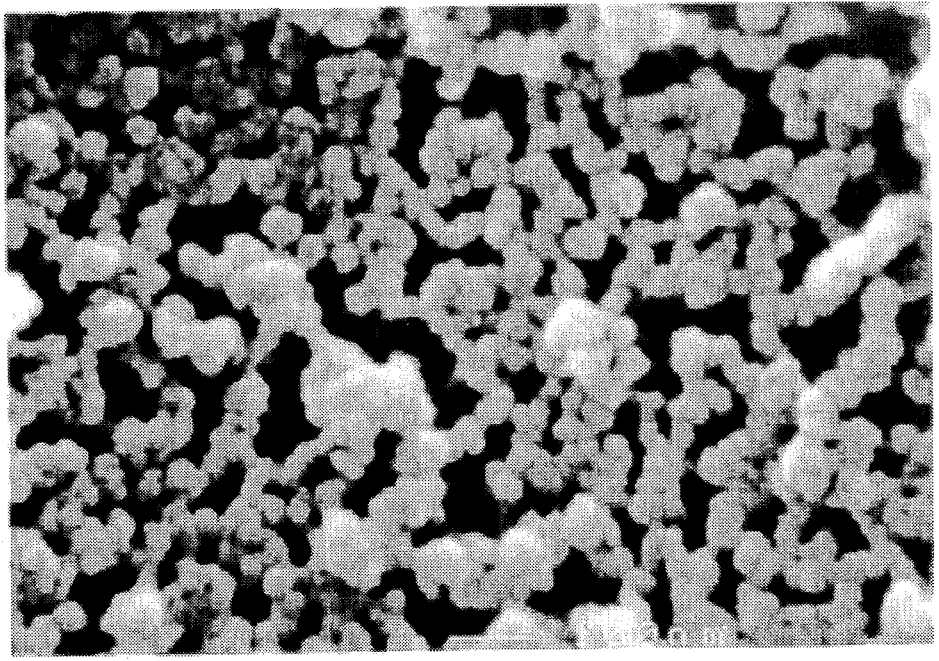

When the antireflection coatings of this invention are observed by electron microscope they can be seen to be porous or dendritic or noncontinuous. This structure is shown in FIGS. 7 and 8. This structure is relatively nondurable and prone to abrasion damage so it is advantageous to use the coatings in environments where they are unlikely to be physically abused, such as inside of multipane windows.

Figure 10:
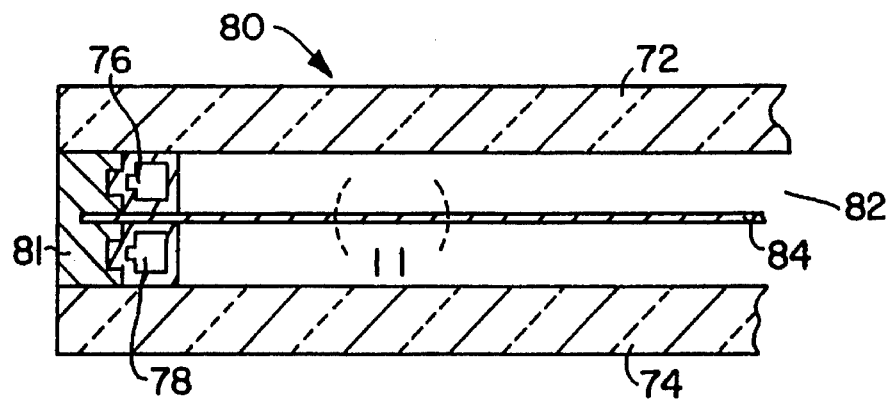
FIGS. 10, 12, 14 and 17 are schematic, not-to-scale views of antireflected plastic substrates in use in glazing structures with expanded scale regions shown in FIGS. 11, 13, 15, 16, and 18, respectively.
Figure 11:
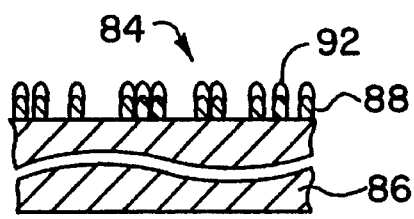

A representative application of the antireflection coating is shown in FIG. 10 as glazing unit 80. Unit 80 includes two glass (or other rigid glazing) sheets 72 and 74 held in parallel spaced relationship by spacers 76 and 78 and sealant 81 and defining internal space 82. A third glazing sheet 84 is located in the internal space 82. It is made of plastic and, as shown in FIG. 11, includes carbon-based plastic substrate 86, sputter-deposited primary metal compound layer 88, and secondary metal compound layer 92. Layers 88 and 92 effectively antireflect the plastic sheet 84.

Figure 12:
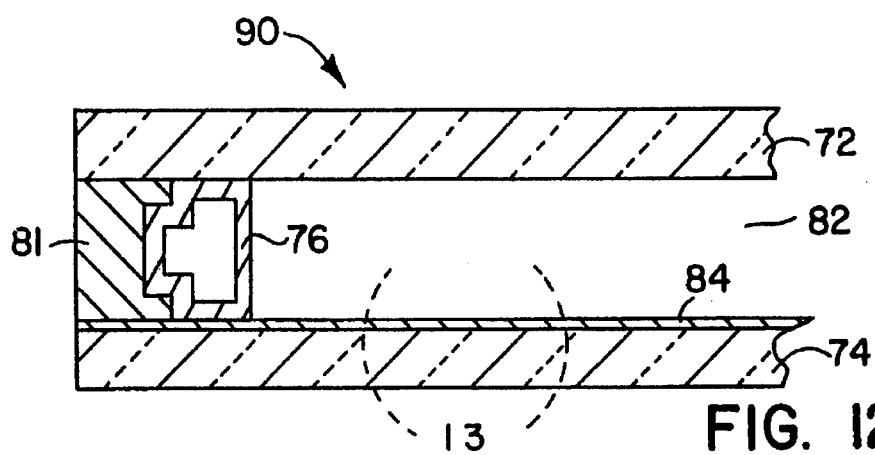
Figure 13:
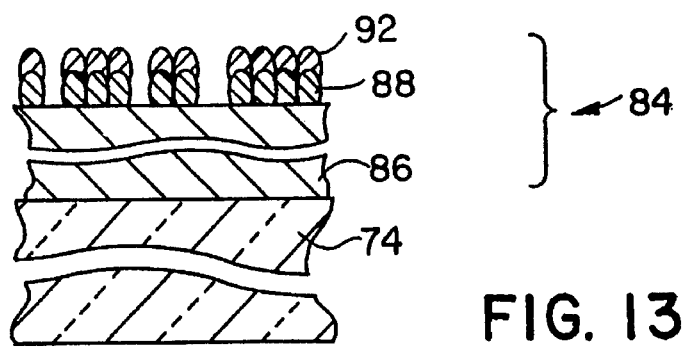

A second representative application is shown in FIG. 12 as glazing unit 90. It has many of the components of unit 80 but has plastic layer 84 present as a coating or laminate directly affixed to one of the rigid nonplastic glazing sheets, 74. As shown in FIG. 13, the antireflection coating has the same type of structure outlined with reference to FIG. 11.

Figure 14:
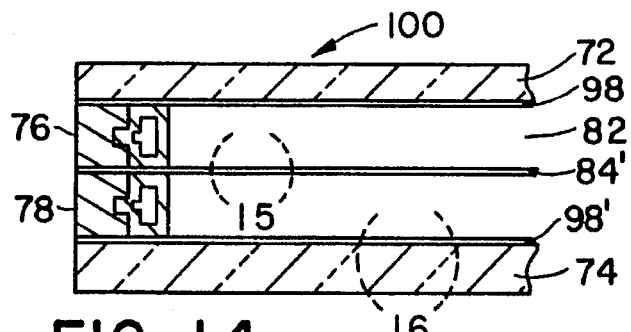
Figure 15:
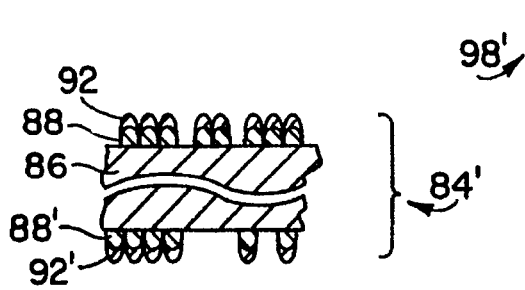
Figure 16:
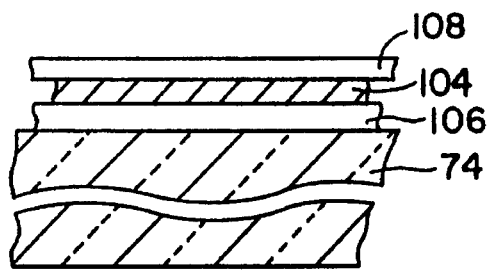

A third representative application is shown in FIG. 14 as glazing unit 100. Unit 100 is similar to unit 70 with the following variations: First, glazing sheets 72 and 74 carry heat-reflecting metal/dielectric induced transmission or interference heat-reflecting stacks 98 and 98' on their respective inner surfaces. As shown in FIG. 10b, these heat-reflecting stacks, e.g. stack 98', is made up of a sequence of layers. Layer 106 is a layer of transparent dielectric, layer 104 is a thin film of metal, preferably silver, and layer 108 is a second layer of dielectric. If desired this can be a five or seven or larger-layer stack. These heat-reflecting filters are sold commercially by Southwall Technologies, Inc. on plastic. They are also described in U.S. Pat. Nos. 4,337,990; 4,017,661 and Re. 90/002223. Unit 100 also has as its internal plastic sheet 84', a material having antireflection layers of this invention on both of its sides. As shown in FIG. 15, these antireflection layers are made up of a primary metal compound layer 88 or 88' and a secondary metal layer 92 or 92' respectively.

Figure 17:
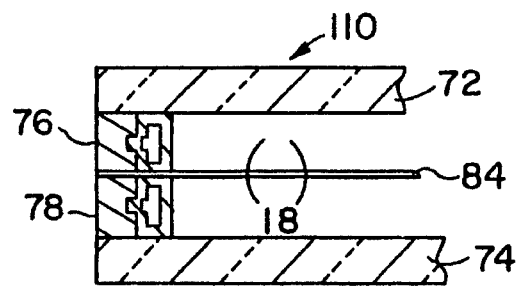
Figure 18:
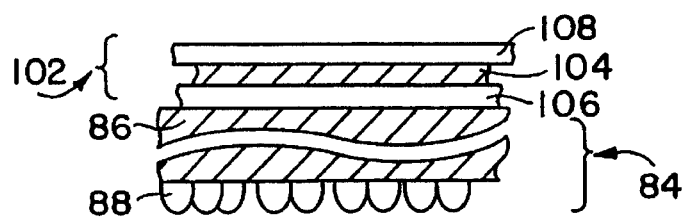

A fourth representative application of the coatings of this invention is shown as glazing unit 110 in FIG. 17. This unit is similar to unit 74 with the changes that sheet 84 carries on its other side a metal/dielectric induced transmission or interference host reflector 106/104/108 as shown in FIG. 18. Also, the antireflection coating is made up of a single layer 88 of primary metal compound.

The invention will be further described by the following examples. They are presented to illustrate the invention and are not to be construed as limitations of the invention defined by the claims.

EXAMPLES

Example I

A roll of 0.003 inch thick PET (ICI 393) was loaded into the roll sputtering machine depicted in FIG. 4. The roll was oriented so that the non-slip or untreated side of the roll faced the sputtering target. A tantalum target (5.0×15.625 inches) was installed into the position marked as 50 in FIG. 4. After pumping down to $2\times10^{-5}$ Torr, argon and oxygen were introduced in to the minichamber at flows of 9.5 and 19 sccm, respectively, to obtain a pressure of $5.24\times10^{-3}$ Torr. Reactive sputtering was done with negative 503 volts applied to the tantalum target to obtain a current of 7.98 Amps. The PET substrate was moved at a linespeed of 3.50 millimeters/sec. The reflection spectrum for the resulting sample is shown in FIG. 3. The tantalum oxide layer reduced the visible reflection (based on a C illuminant) of the PET film from 11.8% to 5.9%.

Example II

In this experiment, a Corning Cover Glass (No. 1, 22×30 mm) was taped to 3 mil ICI 393 PET substrate. After pumping down, tantalum oxide was sputtered as described in Example I. The reflection of the PET substrate was decreased as described in Example 1; however, the reflectivity of the glass plate was increased (i.e., from ca 8% at 400 mn to about 13%).

Example III

For this example, tantalum oxide was sputtered onto 0.005 inch thick polycarbonate manufactured by Rohm and Haas. Deposition conditions were similar to that described in Example I. Argon and oxygen were introduced into the minichamber at flows of 9.5 and 19 sccm, respectively, to obtain a pressure of $4.68\times10^{-3}$ Torr. Reactive sputtering was done with negative 456 volts was applied to the tantalum target to obtain a current of 8.8 Amps. The PET substrate was moved at a linespeed of 3.50 millimeters/sec. The resulting tantalum oxide coating reduced the Illuminant C visible reflection from 10.4% to 8.3%.

Example IV

Three mil thick Teijin PET was loaded into the roll coater shown in FIG. 4. The active coating modules were the dc plasma glow and one cathode position shown in FIG. 4 as items 52 and 50, respectively. For the first pass, the PET roll was oriented so that the non-slip or untreated side of the roll faced the sputtering target and dc glow chamber. A titanium target (5.0×15.625 inches) was installed into the position marked as 50 in FIG. 4. An aluminum rod was used as the electrode in the dc glow. After pumping down to $2\times10^{-5}$ Torr, oxygen was introduced into the sputtering minichamber at a flow of 44.6 sccm, to obtain a pressure of $8.0\times10^{-3}$ Torr. Reactive sputtering was done with negative 419 volts applied to the tantalum target to obtain a current of 15.0

Amps. A flow of 17.5 sccms of air was introduced into the dc glow chamber to obtain a pressure of $11 \times 10^{-3}$ Torr. A negative dc voltage of 1250 Volts was applied to the dc glow rod to obtain a current of 25 mA. The PET was moved through the coating zone at a linespeed of 2.50 millimeters/sec.

For the second pass, the PET roll was flipped so that the slip or treated side of the roll faced the sputtering target and dc glow chamber. Oxygen was introduced into the sputtering minichamber at a flow of 42.9 sccm, to obtain a pressure of $8.0 \times 10^{-3}$ Torr. Reactive sputtering was done with negative 425 volts applied to the titanium target to obtain a current of 15.0 Amps. A flow of 16.8 sccms of air was introduced into the dc glow chamber to obtain a pressure of $11 \times 10^{-3}$ Torr. A negative dc voltage of 1250 Volts was applied to the dc glow rod to obtain a current of 25 mA. The PET was moved through the coating zone at a linespeed of 2.50 millimeters/sec.

When both sides of the Teijin PET were treated as discussed above, the illuminant C reflectivity of the substrate was reduced from 12% to 2.0%. A scanning electron micrograph of the titanium oxide coating discussed here is given as FIGS. 5 and 6.

Example 5

Three mil thick Teijin PET was loaded into the roll coater shown in FIG. 4. The active coating modules were the dc plasma glow and two cathode position shown in FIG. 4 as items 52, 46 and 50, respectively. For the first pass, the PET roll was oriented so that the non-slip or untreated side of the roll faced the sputtering target and dc glow chamber. A titanium target ($5.0 \times 15.625$ inches) was installed into the position marked as 46 in FIG. 4. An indium target ($5.0 \times 15.625$ inches) was installed into the position marked as 50 in FIG. 4. An aluminum rod was used as the electrode in the dc. glow. After pumping down to $2 \times 10^{-5}$ Torr, oxygen was introduced into the titanium sputtering minichamber at a flow of 39.8 sccm, to obtain a pressure of $8.0 \times 10^{-3}$ torr. Oxygen, hydrogen, nitrogen and argon were introduced into the indium chamber at flows of 22.7, 10.3, 4.0 and 5.0, respectively, to obtain a total pressure of $4.0 \times 10^{-3}$ Torr. Reactive sputtering was done with negative 428 volts applied to the titanium target to obtain a current of 15.0 Amps. Negative 310 volts was applied to the indium target to obtain a current of 5.46 Amps. A flow of 17.0 sccms of air was introduced into the dc glow chamber to obtain a pressure of $11 \times 10^{-3}$ Torr. A negative dc voltage of 1250 Volts was applied to the dc glow rod to obtain a current of 25 mA. The PET was moved through the coating zone at a linespeed of 5.00 millimeters/sec.

For the second pass the PET roll was flipped so that the slip or treated side of the roll faced the sputtering target and dc glow chamber. Oxygen was introduced into the titanium sputtering minichamber at a flow of 39.3 sccm, to obtain a pressure of $8.0 \times 10^{-3}$ Torr. Oxygen, hydrogen, nitrogen, and argon were introduced into the indium chamber at flows of 22.3, 10.0, 4.0 and 5.0, respectively, to obtain a total pressure of $4.0 \times 10^{-3}$ Torr. Reactive sputtering was done with negative 426 volts applied to the titanium target to obtain a current of 15.0 Amps. Negative 313 volts was applied to the indium cathode to obtain a current of 5.44 Amps. A flow of 18.2 sccms of air was introduced into the dc glow chamber to obtain a pressure of $12 \times 10^{-3}$ Torr. A negative dc voltage of 1250 Volts was applied to the dc glow rod to obtain a current of 25 mA. The PET was moved through the coating zone at a linespeed of 5.0 millimeters/sec.

When both sides of the Teijin PET were treated as discussed above, the illuminant C reflectivity of the substrate was reduced from 12% to 2.2%. A scanning electron micrograph of the titanium oxide coating discussed here is given as FIG. 7 and 8.

Experiment VI

Using techniques similar to those in the previous experiments, numerous single and double layer coatings using the primary and secondary metal oxides were produced in Teijin PET substrate. This substrate has a visible reflection of about 12% and a visible transmission of about 88% prior to coating. In each case, both slip and non-slip sides of the PET substrate were coated. The optical parameters (i.e., visible reflection, visible transmission, transmission yellowness index, and transmission haze) obtained for various samples are summarized in the following table. These samples were all prepared using a dc glow to pretreat the PET substrate to enhance coating adhesion. Note that the exact optical parameters obtained is know to depend on coating thickness, substrate type, and glow conditions. Generally a higher energy dosage provided by the glow results in less reflection suppression.

| Coating | % $R_{vis}$ | % $T_{vis}$ | T (YID) | T % Haze |
|---|---|---|---|---|
| $WO_x$ | 2.5 | 96.6 | 2.0 | 1.04 |
| $WO_x$ & $InO_x$ | 2.7 | 96.6 | 2.1 | 0.86 |
| $TaO_x$ | 3.8 | 96.2 | 2.6 | 0.86 |
| $TaO_x/InO_x$ | 3.4 | 96.0 | 2.1 | 0.74 |
| $NbO_x$ | 1.7 | 97.6 | 1.8 | 1.03 |
| $NbO_x/InO_x$ | 4.3 | 95.1 | 2.7 | 0.68 |
| $TiO_x$ | 2.0 | 96.8 | 2.5 | 1.11 |
| $TiO_x/InO_x$ | 2.2 | 97.0 | 2.2 | 0.72 |
| $HfO_x$ | 4.1 | 93.0 | 4.5 | 2.18 |
| $HfO_x/InO_x$ | 3.8 | 95.3 | 2.8 | 0.72 |
| $ZrO_x$ | 2.2 | 96.9 | 2.3 | 0.90 |

What is claimed is:

1. An antireflective composite having antireflection properties comprising a solid organic polymer substrate presenting a surface to be antireflected having adhered to said surface an antireflection layer comprising a 10 to 300 nm thick discontinuous layer having a packing density of from 0.1 to 0.7 of 5 to 250 nm diameter oolitic-dendritic aggregates of transparent metal oxide or oxynitride having an index of refraction greater than the index of refraction of the polymer substrate.

2. The antireflective composite of claim 1 wherein the median thickness of the discontinuous layer of transparent inorganic metal oxide or oxynitride is from 50 to 200 nm.

3. The antireflective composite of claim 1 wherein the polymer substrate has an index of refraction of from about 1.4 to 1.7.

4. The antireflective composite of claim 3 wherein the transparent metal oxide or oxynitride has an index of refraction of from about 1.7 to about 2.7.

5. The antireflective composite of claim 4 wherein the transparent metal oxide or oxynitride comprises a member selected from the group consisting of oxides and oxynitrides of tantalum, titanium, niobium, hafnium, tungsten and zirconium.

6. The antireflective composite of claim 5 wherein the organic polymer substrates is selected from the group consisting of polyester, polycarbonate, polyacrylate and polymethacrylate.

7. The antireflective composite of claim 6 wherein the organic polymer substrate is polyethyleneterephthalate.

8. An antireflective composite having a visible light reflectance below 8% comprising a polyester substrate having an index of refraction of from about 1.4 to 1.7 and a surface having an inherent reflection of about 12%, said surface having adhered thereto a discontinuous 70 to 170 nm thick antireflection layer of oolitic-dendritic aggregates of a transparent inorganic metal compound, said aggregates having a diameter of 5–250 nm and a packing density of 0.2 to 0.7, said layer having an index of refraction of from 1.7 to 2.7, and said transparent inorganic metal compound being selected from the group consisting of oxides and nitrides of tantalum, titanium, niobium, hafnium, tungsten and zirconium.

9. The polyester of claim 8 wherein the polyester is polyethyleneterephthalate.

10. An antireflective composite comprising a solid organic polymer substrate having adhered thereto a discontinuous 10–300 nm thick antireflection material, said material having a first layer of oolitic-dendritic aggregates of a first transparent inorganic metal oxide or oxynitride, said aggregates having a diameter of 5–250 nm and a second layer of oolitic-dendritic aggregates of a second transparent inorganic metal oxide or oxynitride, said aggregates having a diameter of 5–250 nm and being adhered to and built upon the first layer and wherein each of the first and second layers has an index of refraction which is greater than the index of refraction of the polymer substrate the antireflection material as a whole has a packing density of 0.1 to 0.7.

11. The antireflective composite of claim 10 wherein the first and second transparent metal oxides or oxynitrides have an index of refraction of from about 1.7 to about 2.7.

12. The antireflective composite of claim 11 wherein the first transparent metal oxide or oxynitride comprises a member selected from the group consisting of oxides and oxynitrides of tantalum, titanium, niobium, hafnium, tungsten and zirconium and said second transparent metal oxide or oxynitride comprises a member selected from the group consisting of oxides and oxynitrides of zinc, tin and indium.

13. The antireflective composite of claim 12 wherein the substrate is selected from the group consisting of polyester, polycarbonate, polyacrylate and polymethacrylate.

14. The antireflective composite of claim 12 wherein the total thickness of the discontinuous antireflection layer is from 50 to 200 nm with the thickness of the layer of the first transparent metal oxide or oxynitride being from 25% to about 75% of said total thickness.

15. An antireflective composite having a visible light reflectance below 8% comprising a polyester substrate having an index of refraction of from about 1.4 to 1.7 and having an inherent reflectance of about 12% and having adhered thereto a first layer of a 25 to 100 nm thick, discontinuous antireflection material, said first layer having oolitic-dendritic aggregates of a first transparent inorganic metal compound selected from the group consisting of oxides and oxynitrides of tantalum, titanium, niobium, hafnium, tungsten and zirconium, said aggregates having a diameter of 5–250 nm and a second layer of oolitic-dendritic aggregates of a second transparent inorganic metal compound selected from the group consisting of oxides and oxynitrides of zinc, tin and indium, said aggregates having a diameter of 5–250 nm and being adhered to and built upon the first layer and wherein each of the first and second layers has an index of refraction of 1.7 to 2.7 and the antireflection material as a whole has a packing density of 0.2 to 0.7.

16. The antireflective composite of claim 15 wherein the polyester substrate is polyethyleneterephthalate.

17. A process for imparting antireflection properties to a composite material comprising sputter-depositing upon a solid organic polymer substrate a 10–300 nm thick discontinuous antireflection layer of oolitic-dendritic aggregates of a transparent inorganic metal oxide or oxynitride, said aggregates having a diameter of 5–250 nm and a packing density of 0.1 to 0.7, said antireflection layer having an index of refraction greater than the index of refraction of the substrate.

18. The process of claim 17 wherein said sputter-depositing is reactive sputter-depositing.

19. The process of claim 18 wherein the discontinuous layer has a thickness of from about 50 to 200 nm and wherein the transparent metal oxide or oxynitride comprises a member selected from the group consisting of oxides and oxynitrides of tantalum, titanium, niobium, hafnium, tungsten and zirconium.

20. A process for imparting antireflection properties to a composite material comprising sputter-depositing upon a solid organic polymer substrate a 10–300 nm thick discontinuous antireflection material said material having a first layer of oolitic-dendritic aggregates of a first transparent inorganic metal oxide or oxynitride, said aggregates having a diameter of 5–250 nm and a second layer of oolitic-dendritic aggregates of a second transparent inorganic metal oxide or oxynitride, said aggregates having a diameter of 5–250 nm and being adhered to and built upon the first layer and wherein each of the first and second layers has an index of refraction which is greater than the index of refraction of the polymer substrate and the antireflection material as a whole has a packing density of 0.1 to 0.7.

21. The process of claim 20 wherein said sputter-depositing is reactive sputter-depositing.

22. The process of claim 21 wherein said first layer of aggregates is 25 to 100 nm in thickness and comprises a material selected from the group consisting of oxides and oxynitrides of tantalum, titanium, niobium, hafnium, tungsten and zirconium and said second layer is 25 to 100 nm thick and comprises a material selected from the group consisting of oxides and oxynitrides of zinc, tin and indium.

23. A window glazing unit comprising a sheet of glazing of the antireflective composite of claim 1.

24. A window glazing unit comprising a sheet of glazing of the antireflective of claim 10.

* * * * *